United States Patent [19]

Minami et al.

[11] Patent Number: 4,495,410
[45] Date of Patent: Jan. 22, 1985

[54] LIGHT RECEIVING AUTOMATIC GAIN CONTROL CIRCUIT

[75] Inventors: Takatoshi Minami, Kawasaki; Hiroshi Nishimoto, Yokohama, both of Japan

[73] Assignee: Fujitsu Ltd., Kawasaki, Japan

[21] Appl. No.: 349,090

[22] PCT Filed: Jun. 15, 1981

[86] PCT No.: PCT/JP81/00138
§ 371 Date: Feb. 5, 1982
§ 102(e) Date: Feb. 5, 1982

[87] PCT Pub. No.: WO82/00073
PCT Pub. Date: Jan. 7, 1982

[30] Foreign Application Priority Data

May 25, 1980 [JP] Japan ................................. 55-85246

[51] Int. Cl.³ ............................................. H01J 40/14
[52] U.S. Cl. ......................... 250/214 AG; 307/360; 330/138
[58] Field of Search .......... 250/206, 208, 209, 214 R, 250/214 AG; 307/264, 359, 360, 362; 330/138, 280

[56] References Cited

U.S. PATENT DOCUMENTS 4,124,825 11/1978 Webb et al. ................... 330/279
4,236,069 11/1980 Laughlin ................... 250/214 AG
4,399,416 8/1983 Gillespie ..................... 330/280

FOREIGN PATENT DOCUMENTS 53-58748 5/1978 Japan.
53-90802 8/1978 Japan.

Primary Examiner—David C. Nelms
Attorney, Agent, or Firm—Staas & Halsey

[57] ABSTRACT

Circuitry for optimizing the signal-to-noise ratio of a light receiving circuit having an avalanche photo diode to receive the light and an amplifier connected thereto to provide an output signal, the level of the output signal being kept constant despite variations in the light input level by controlling the multiplication factor of the avalanche photo diode and the gain of the amplifier. For this purpose, when the light input level is low, the multiplication factor control voltage for the avalanche photo diode is controlled through a loop which includes a differential amplifier, a diode, and a high voltage generator circuit. When the output of the differential amplifier becomes negative, the automatic gain control voltage for the amplifier is controlled, and when the automatic gain control voltage becomes equal to the reference voltage for an additional differential amplifier, the multiplication control voltage is controlled so that it becomes low by reducing the reference voltage to a further differential amplifier. When the output of the additional differential amplifier is saturated, the multiplication factor control voltage is clamped and only the automatic gain control voltage changes. Thereby the amplification factor and gain can be adjusted to the optimum values. Additional embodiments are also disclosed.

12 Claims, 19 Drawing Figures

LIGHT RECEIVING AUTOMATIC GAIN CONTROL CIRCUIT

BACKGROUND OF THE INVENTION

This invention relates to a light receiving circuit used for repeaters and terminals, etc., in an optical transmission system.

Repeaters are used in optical transmission systems in order to transmit light signals to the remote terminals. A repeater converts the received light signal into an electrical signal and converts it again into a light signal after waveform equalization and shaping, and finally transmits it to the next repeater. In the terminal station, on the other hand, the received light signal is converted into an electrical signal and thereafter demodulation is carried out.

Automatic gain control (AGC) is carried out at repeaters and terminals so that an electrical signal of constant level can be obtained even if the level of the received light signal changes. FIG. 1 is an ordinary light receiving circuit having an automatic gain control circuit. In this FIG, 11 is a light signal; 12 is an avalanche photo diode (APD); 13 is an amplifier; 14 is a level detector; 15 is the output terminal; 16 is an AGC circuit.

The following methods are currently proposed for executing AGC using the circuit shown in FIG. 1.
(a) Only the multiplication factor M of APD 12 is controled. For example, when the light input level is doubled, M of the APD is reduced to a half (½).
(b) The same as method (a) for low input levels with: M of the APD being fixed for high input levels and with the gain of amplifier 13 being controlled.
(c) The same as method (a) for low input levels as is proposed in the published unexamined Japanese patent application No. 53-58748. The gain amplifier 13 is changed step by step for high input levels and simultaneously M of the APD 12 is also controlled.

The methods listed above will contribute to providing an electrical signal of a constant level as an output even when the level of a received light signal changes. FIGS. 2 (1) to (3) show the relation between the light input level P, the multiplication factor M of the APD and the gain G of the amplifier in the methods (a) to (c) given above. In the same figures, the solid line indicates M, the broken line indicates G and the chained line indicates the optimum value of M, explained later. $M_{min}$ is the minimum value of the applicable multiplication factor of the APD. When $M < M_{min}$, which is not practical, the response speed of APD becomes very low due to an increase of the capacitance.

On the other hand, the signal to noise ratio (SNR) of the output signal of amplifier 13 is basically given by the following equation.

$$SNR = (I_o PM)^2 / (N_s PM^{2+x} + Nth) \quad (1)$$

Where,
$I_o$: APD output current for unit light input (when $M=1$)
P: APD light input power
M: APD multiplication factor
$N_s$: APD shot noise current power for unit light input (when $M=1$)
x: Excessive noise figure of the APD
Nth: Converted input noise current power of the next stage amplifier of APD The equation (1) teaches that SNR depends on P and M, and the optimum value $M_o$ for M gives the best SNR. From the equation (1), the dependency of $M_o$ on the light input level is expressed as follows.

$$M_o = [(2/x)(N_{th}/N_{sp})]^{1/(2+x)} \quad (2)$$

Therefore,
$$M_o \propto P^{-1/(2+x)} \quad (3)$$

Usually, x is selected to be a value ranging from 0.3 to 1.

The gain G of the amplifier corresponding to $M_o$ is automatically determined from the condition that the output of the amplifier is maintained at a constant level and the determined gain is the optimum value. Here, since there is a difference between the M which keeps an electrical signal at a constant level and said optimum value $M_o$, the SNR deteriorates if only an electrical signal level is kept at a constant level. FIG. 3 (1), (2) and (3) show such conditions. Namely, the figures show the relation between light input and SNR corresponding to the methods (a), (b) and (c). The solid line in the figure shows the ideal values, while the broken lines 32, 33, 34 respectively show the values of the methods (a), (b) and (c). Explained below is the reason why the solid line 31 and broken lines 32, 33, and 34 cross at the point $P_0$, and the solid line 31 and the broken lines 33 and 34 cross at the point $P_3$. As shown in FIG. 2 (1), (2), (3), the value of M crosses the optimum value $M_o$ at the points $P_0$ and $P_3$. At the point $P_0$, M becomes equal to $M_o(M=M_o)$ by the setting, while at the point $P_3$, M becomes also equal to $M_o$. In a method being employed currently in order to improve the SNR, a value of M is not lowered to $M_{min}$ but instead is always kept at a value which is larger than than the value $M_1(>M_{min})$. Thereby, before the SNR deviates largely from the value $SNR_o$ for the condition $M=M_o$, M is limited by $M_1$ and the SNR is improved. This is shown in FIG. 4 with an example of the method (b). In the same figure, the solid lines 41, 44 and 47 show the ideal conditions, while the broken lines 42, 45, 48 show the conditions of the method (b), and the chained lines 43, 46, and 49 show the condition where M is larger than $M_1$. However, the method where M is kept larger than $M_1$ also has the following disadvantage. Namely, since the minimum value of M becomes $M_1(>M_{min})$, the additional gain variation width required is as much as $(M_1/M_{min})$ in order to obtain the desired dynamic range. As can be understood from FIG. 4, when $M > M_{min}$, the amplifier gain width required only ranges from G1 to G2, but when $M > M_1$, it must range from G1 to $G_3(G_2>G_3)$. As proposed in the unexamined Japanese patent application No. 53-90802, it is possible to simultaneously control the M of the APD and the gain of the amplifier in combination so that M of the APD always satisfies the equation (3) as shown in FIG. 2 (4) for variations of the light input level, but it has a disadvantage in that the control circuit is complicated.

SUMMARY OF INVENTION

With consideration to the abovementioned existing method, it is an object of the present invention to provide a light receiving circuit which assures a large light input dynamic range, based on the idea that the optimum values for M and amplifier gain for obtaining the optimum SNR are determined by the polygonal line approximation method, without allowing the SNR to largely deviate from the optimum value and without widening the desired variable gain range of the amplifier. This object is attained by a light receiving circuit wherein the amplifier output is kept at a constant by automatic gain control of the multiplication factor of an avalanche photo diode which converts a light signal into an electrical signal and automatic gain control of the amplifier which amplifies the output of the avalanche photo diode, thus characterized in that the circuit is provided with a first comparing means which compares a voltage proportional to the voltage of the multiplication factor control terminal of the avalanche photo diode and a first reference voltage, a second comparating means which compares the output of the amplifier and a second reference voltage, a third comparing means which compares a third reference voltage and a control voltage for automatic gain control of the amplifier, a high voltage generator circuit which supplies an output to the multiplication factor control terminal of the avalanche photo diode, and a switch device which selectively changes over the outputs of the first and second comparing means outputs of first and second comparing means are connected to the switch device, the output of the switch device is connected to the input of the high voltage generator circuit, output of the second comparing means is coupled to the control voltage input terminal for automatic gain control of the amplifier and the output of the third comparing means is coupled to the first reference voltage generator circuit, and thereby a voltage output which gives a multiplication factor which approximates (by a polygonal line) the multiplication factor of an avalanche photo diode satisfying the optimum signal to noise ratio is obtained at the multiplication factor control terminal of said avalanche photo diode, while a voltage output which makes the output voltage of the amplifier constant in accordance with the multiplication factor can be obtained at said control voltage input terminal for automatic gain control of the amplifier.

DESCRIPTION OF THE PREFERRED EMBODIMENT

Figure 1:
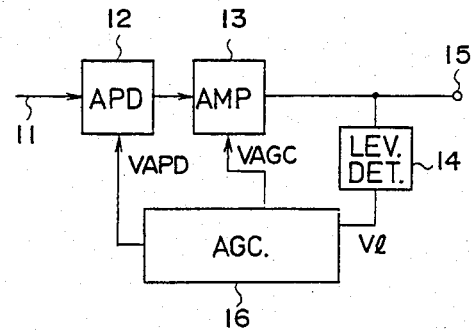
FIG. 1 is a block diagram for explaining a light receiving circuit.
Figure 2A:
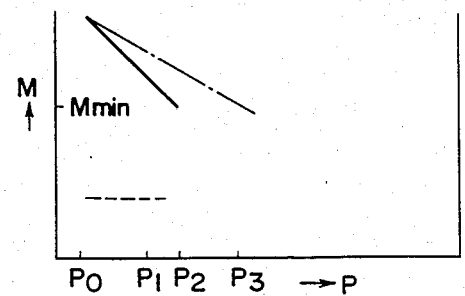
FIG. 2 indicates the relation between the multiplication factor M of APD and the gain G of the amplifier as a function of light input for various conventional light receiving circuit methods.
Figure 2B:
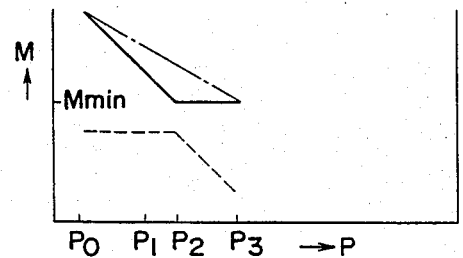
Figure 2C:
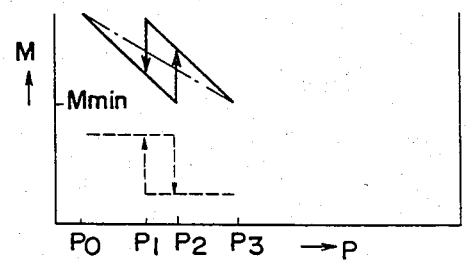
Figure 2D:
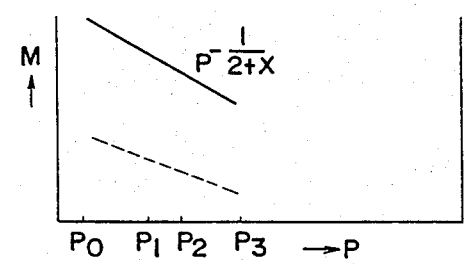
Figure 3A:
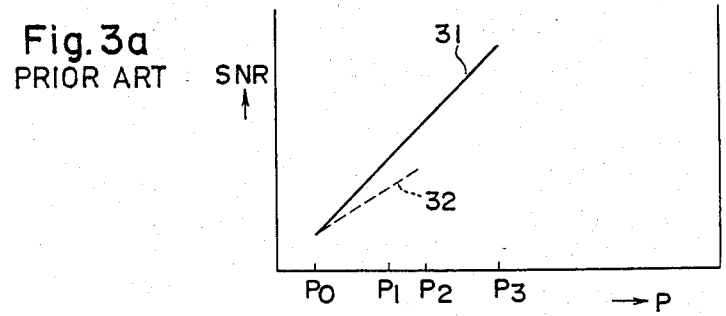
FIG. 3 indicates the relation between light input and SNR in three methods of FIG. 2.
Figure 3B:
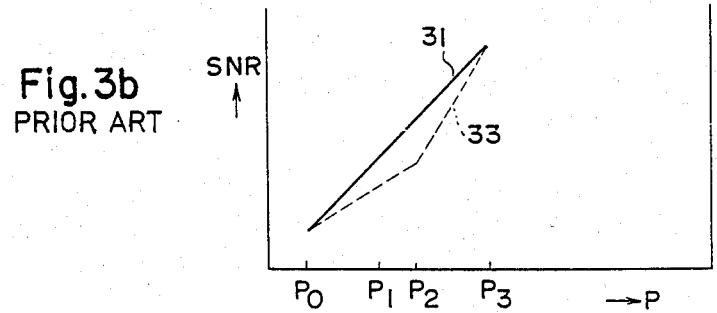
Figure 3C:
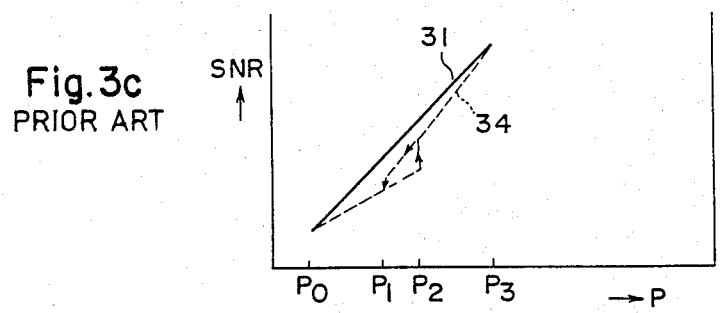
Figure 4:
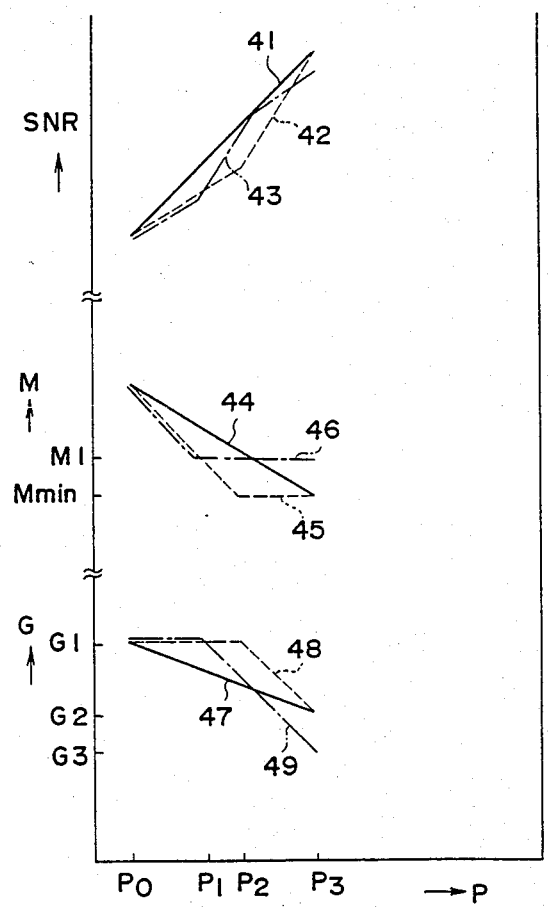
FIG. 4 indicates the relation between light input vs SNR, M and G when the value of M is kept larger than $M_1$ a method used in conventional light receiving circuits.
Figure 5:
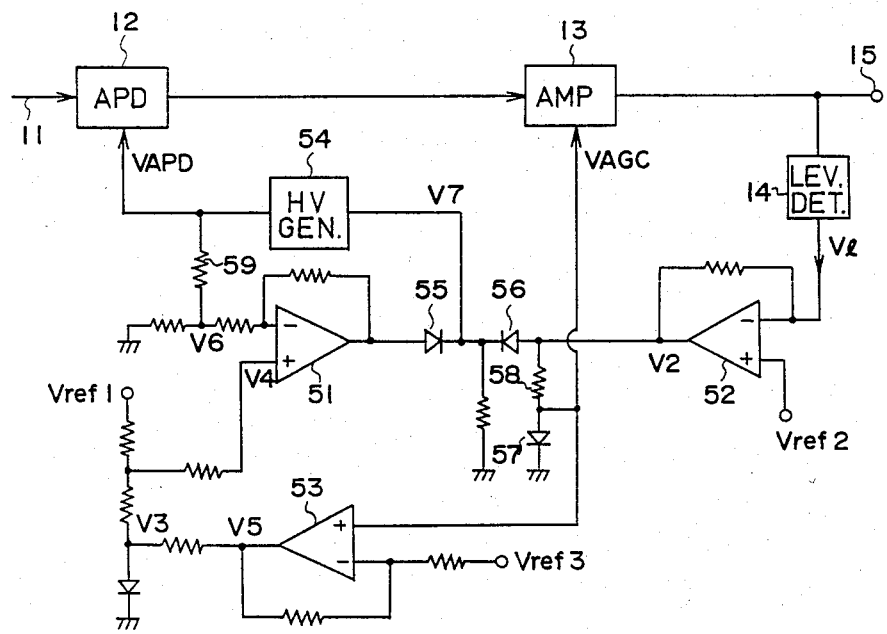
FIG. 5 is the schematic diagram of an embodiment of the light receiving circuit of the present invention.

The preferred embodiment of the present invention will be explained by referring to FIG. 5 to FIG. 14. FIG. 5 is a circuit diagram of the embodiment of the present invention. A light signal 11 is applied to the APD 12, the an APD output of which is connected is amplified by the amplifier 13 and output to the output terminal 15. The output of the amplifier 13 is also connected to the level detector 14 and the output voltage $V_l$ of the level detector 14 is applied to the inverting input of the second comparator 52 consisting of a differential amplifier. To the non-inverting input of the second comparator 52, a second reference voltage $V_{ref2}$ is applied. The output voltage $V_2$ of the second comparator 52 is connected to the AGC control terminal input of the amplifier 13 via the resistor 58, supplying the AGC control voltage $V_{AGC}$ thereto. The output of the second comparator 52 passes a switch device which includes the diode 56, supplying an input voltage $V_7$ to the high voltage generator circuit 54. The output voltage $V_{APD}$ of the high voltage generator circuit 54 applied as an input to the APD 12, and simultaneously $V_{APD}$ is divided into a voltage $V_6$ via the resistor 59. The voltage $V_6$ is being applied to the inverting input of the first comparator 51, consisting of a differential amplifier. To the non-inverting input of the first comparator 51, a voltage $V_4$ obtained by dividing a first reference voltage $V_{ref1}$ is applied. The output of the first comparator 51 is applied as an input to the high voltage generator circuit 54 after passing a switch device which includes the diode 55. The voltage $V_{AGC}$ is supplied to the non-inverting input of the third comparator 53, consisting of a differential amplifier, while a third reference voltage $V_{ref3}$ is applied to the inverting input. The output voltage $V_5$ of the third comparator 53 determines a voltage $V_4$ in combination with the first reference voltage $V_{ref1}$.

Figure 6:
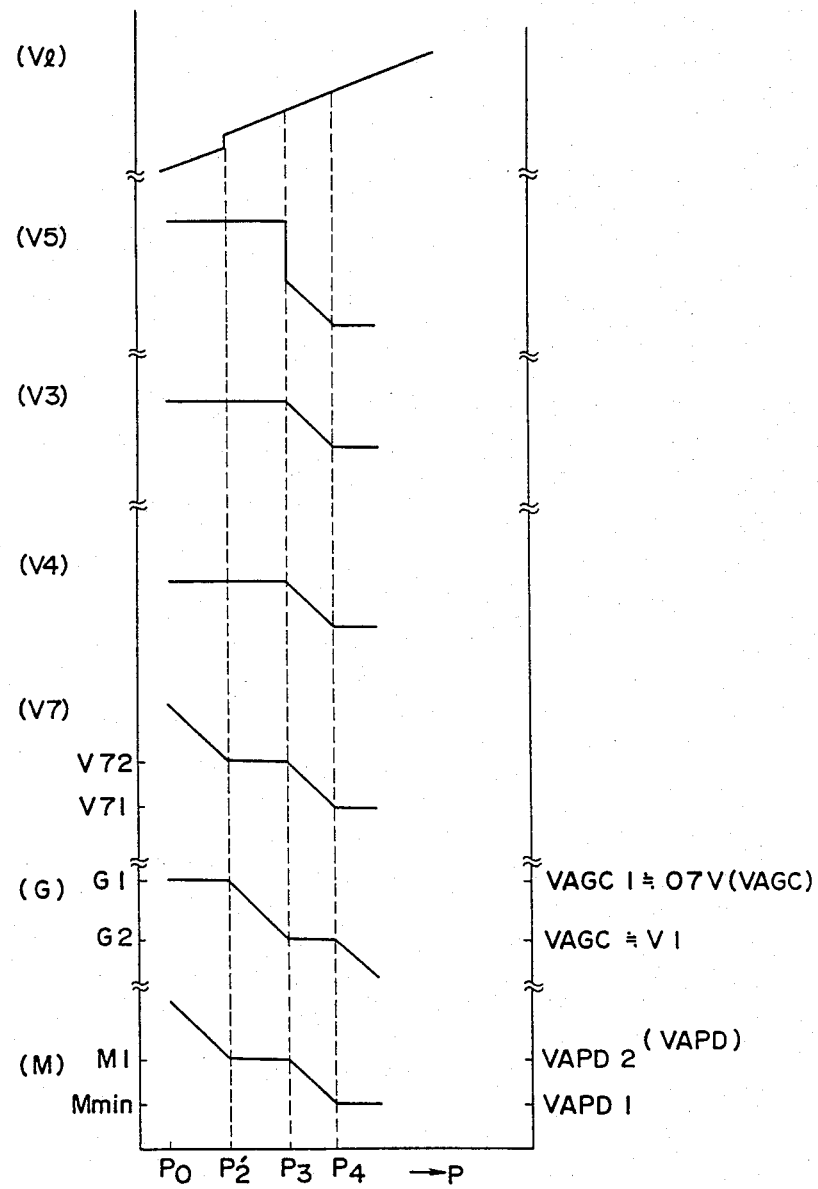
FIG. 6 indicates the voltages, M and G as a function of light input for the circuit shown in FIG. 5.
Figure 7:
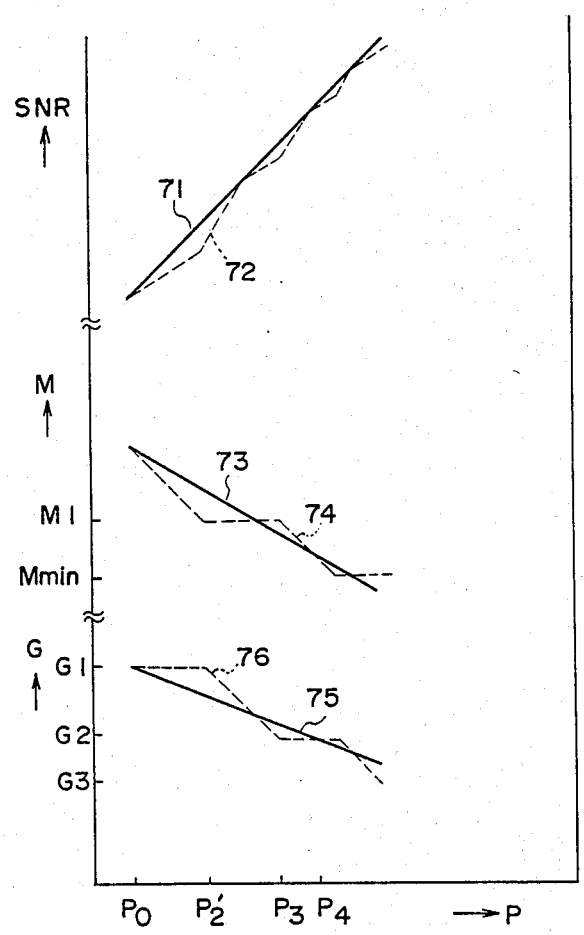
FIG. 7 indicates the relation between SNR, M and G as a function of light input for the circuit shown in FIG. 5.
Figure 8:
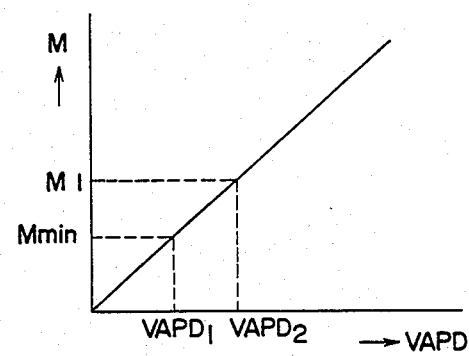
FIG. 8 indicates the relation between $V_{APD}$ and M of an APD.
Figure 9:
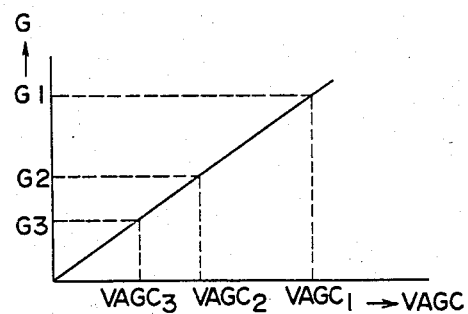
FIG. 9 indicates the relation between $V_{AGC}$ and G of an amplifier.
Figure 10:
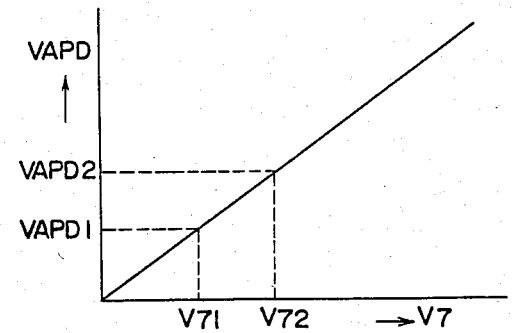
FIG. 10 indicates the relation between the input voltage $V_7$ and the output voltage $V_{APD}$ of the high voltage generator circuit.

The operations of the above circuit will now be explained by referring to FIG. 6. Starting with a low light input level, M is adjusted to the optimum value and the gain G of amplifier 13 is at the maximum. When the light input gradually increases, the voltage $V_l$ rises as shown in the figure. As a result, the output voltage $V_2$ of the second comparator is gradually reduced. Since the voltage $V_2$ is positive, it is applied to the high voltage generator circuit 54, passing the diode 56, and thereby a voltage $V_{APD}$ is obtained as the output. The voltage $V_{APD}$ is also reduced as the voltage $V_2$ reduces. Thus, M of the APD is also reduced. The voltage $V_{APD}$ falls until the voltage $V_6$ divided from the voltage $V_{APD}$ reaches the voltage $V_4$ divided from the first reference voltage $V_{ref1}$. When the light input level is given as $P_2'$, the voltage $V_6$ reaches the voltage $V_4$, and the output of the first comparator becomes positive and thereby turns diode 55 ON, forming a loop through the first comparator 51 and the high voltage generator circuit 54, to keep a $V_{APD}$ at a constant. Therefore, the value of M becomes a constant. As was explained above, the voltage $V_2$ is positive until the light input level reaches the point $P_2'$ in FIG. 6 and is clamped by the diode 57. However, when the light input increases further, causing the voltage $V_I$ to rise and the voltage $V_2$ to fall to a negative voltage, the voltage $V_{AGC}$ is reduced and thereby the gain G of the amplifier 13 also falls. When the voltage $V_2$ further and the light input level reaches $P_3$, the third reference voltage $V_{ref3}$ is reached. Thus, the output voltage $V_5$ of the third comparator 53 changes from a positive to negative, causing the voltage $V_3$ to change to a negative. When the light input level reaches the point $P_4$, the output voltage $V_5$ is saturated, and the voltage $V_3$ is lowered until the voltage $V_5$ reaches a negative saturation level. As a result the voltage $V_4$ falls accordingly until it reaches a value corresponding to the saturation level of the voltage $V_5$. Thereby, the $V_{APD}$ and the value of M fall in the same way, and when M reaches a constant value corresponding to the saturation level of $V_5$, they are fixed by this value. When the value of M is fixed at a constant value, the $V_{AGC}$ is further reduced and the gain G is also lowered. In case the light input level is within the range from $P_3$ to $P_4$, the gain G falls since the magnitude of $V_{AGC}$ falls, but it is as small as 1/(gain of comparator 53) as compared with the variation of M, and therefore it is indicated as a constant value for simplification of the explanation. FIG. 7 uses solid lines 71, 73 and 75 to show the optimum values of SNR, M and G as a function of light input, and it also shows the approximate values obtained by the light receiving circuit of the above-described embodiment of the present invention with broken lines 72, 74 and 76. FIG. 8 shows a graph indicating an example of the relation between $V_{APD}$ and M of APD 12. FIG. 9 is a graph indicating an example of the relation between $V_{AGC}$ and the gain G of amplifier 13. FIG. 10 shows a graph indicating the relation between the input voltage $V_7$ and output voltage $V_{APD}$ of the high voltage generator circuit 54.

Figure 11:
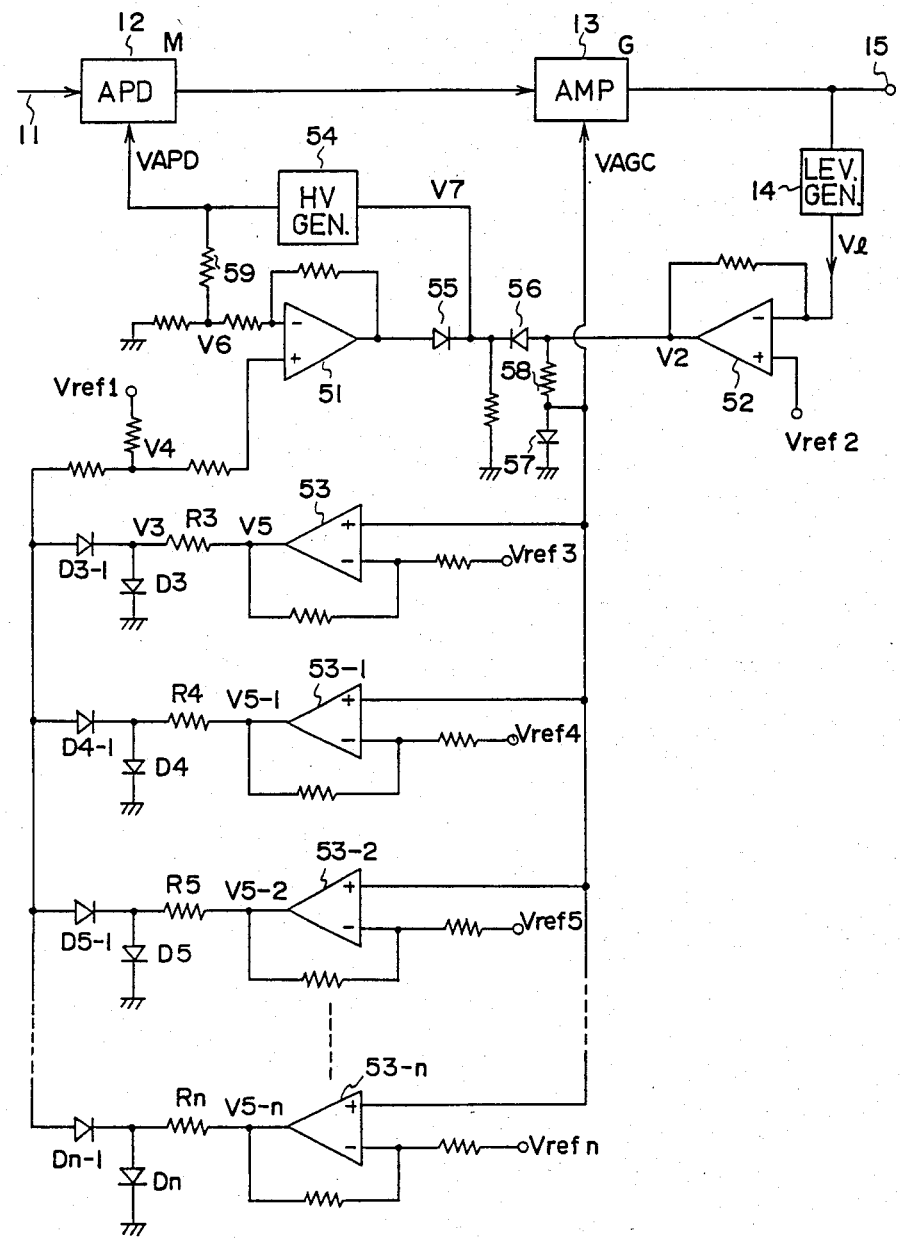
FIG. 11 shows another embodiment of the present invention.

In the above embodiment, the multiplication factor M of the APD approximates the optimum value $M_0$ with a polygonal line having three turning points (the gain G, automatically approximates the ideal condition), but it is also possible to obtain a modification of the embodiment which better approximates the optimum value of the SNR by additionally providing in parallel a plurality of the third comparators illustrated in FIG. 11 and by suitably setting the reference voltages corresponding to the third reference voltage.

Namely, the comparators 53-1, 53-2 to 53-n are provided in parallel to the comparator 53, and the reference voltages $V_{ref4}$, $V_{ref5}$ to $V_{refn}$ are applied to the inverting inputs while $V_{AGC}$ is applied to the non-inverting inputs. The outputs of the comparators 53-1 to 53-n are connected with the resistors $R_4$, $R_5$ to $R_n$, diodes $D_4$ to $D_n$, and diodes $D_{4-1}$ to $D_{n-1}$. Here, the voltages $V_{ref3}$, $V_{ref4}$, $V_{ref5}$ to $V_{refn}$ are related as follows $V_{ref3} > V_{ref4} > V_{rev5} \ldots > V_{refn}$, while the resistors $R_3$, $R_4$, $R_5$ to $R_n$ are related as follows $R_3 > R_4 > R_5 \sim > R_n$. The operation will be explained below.

Figure 12:
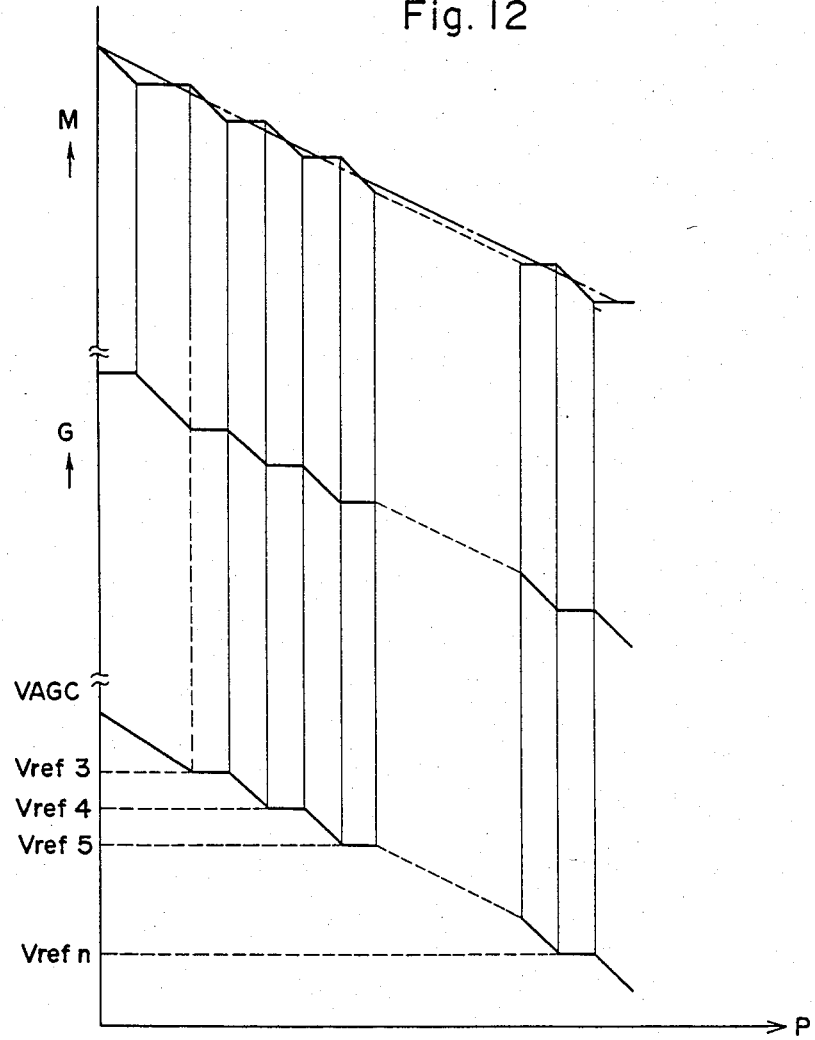
FIG. 12 explains the of the circuit of FIG. 11.

The steps up to saturation of the output voltage of the comparator 53 in FIG. 11 are the same as those of the circuit shown in FIG. 5. When the value of $V_{AGC}$ falls lower than the reference voltage $V_{ref4}$ as shown in FIG. 12, the output voltage $V_{5-1}$ of the comparator 53-1 becomes negative and thereby the voltage $V_4$ is also lowered. Since the voltage $V_4$ is lowered until the output voltage $V_{5-1}$ is saturated, the value of $V_{APD}$ is also lowered in accordance with the voltage $V_4$. As a result, M is also lowered until the output voltage $V_{5-1}$ is saturated. M maintains a constant value until the voltage $V_{AGC}$ becomes lower than the reference voltage $V_{ref5}$ after the output voltage $V_{5-1}$ is saturated and thereafter it is further lowered in the same way as mentioned above. The chained line in FIG. 12 indicates the optimum values.

Figure 13:
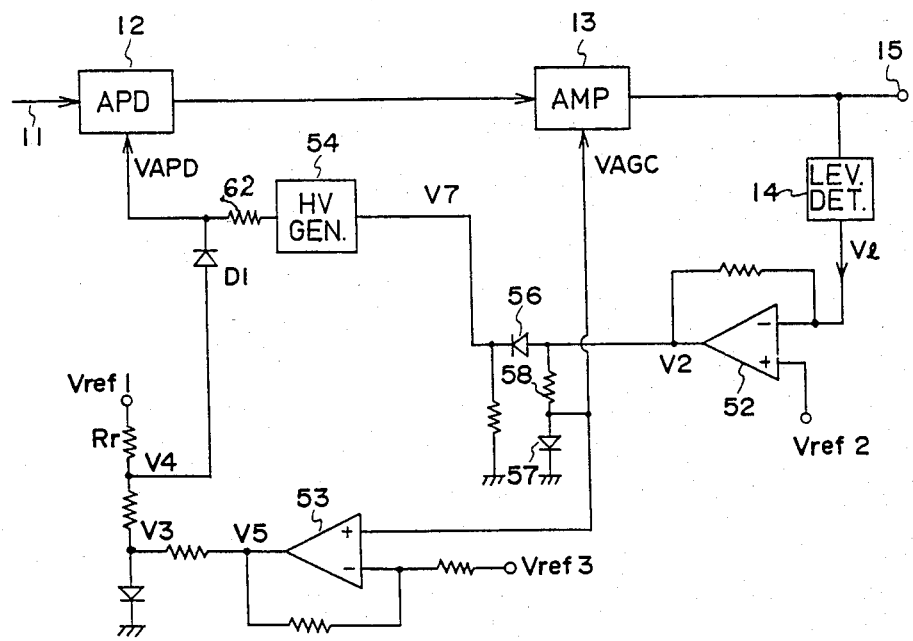
FIG. 13; shows another embodiment of the present invention.

FIG. 13 shows another embodiment of the present invention. The circuit indicated has the same functions as those of the circuit shown in FIG. 5. The only difference from the circuit of FIG. 5 is that the comparator 51 and associated elements diode 55, and resistor 59 are removed, and the output of the high voltage generator circuit 54 is connected to a resistor which is connected to the reference power supply $V_{ref1}$ via the diode $D_1$ and another resistor.

Figure 14:
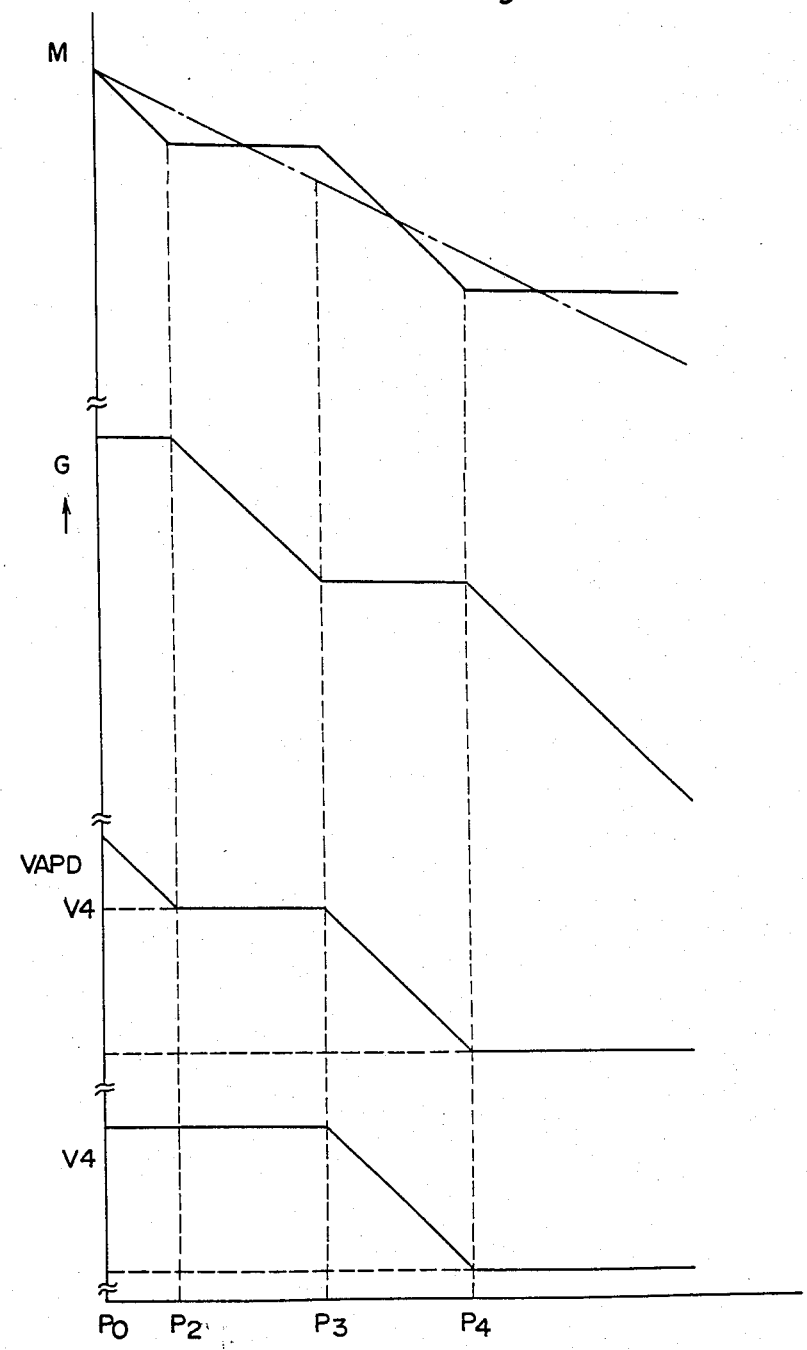
FIG. 14 explains of the circuit of FIG. 13.

The circuit operation will be explained by referring to FIG. 14. When the light input level is low, the voltage $V_I$ is lower than the reference voltage $V_{ref2}$. Therefore, the output voltage $V_2$ of the comparator 52 is positive and is applied to the high voltage generator circuit 54 as the voltage $V_7$ via the diode 56. When the light input level becomes high, the voltage $V_7$ is lowered and also the voltage $V_{APD}$ becomes low. When the light input level reaches $P_2'$, the voltage $V_I$ becomes equal to the reference voltage $V_{ref2}$, the output voltage $V_2$ becomes negative, the diode 56 turns OFF and the voltage $V_{APD}$ becomes equal to the voltage $V_4$, the voltage $V_{APD}$ being clamped to $V_4$. Thereby, M becomes constant and the gain G is lowered since the voltage $V_{AGC}$ becomes low. When the light input exceeds the point $P_3$, the voltage $V_{AGC}$ becomes lower than the reference voltage $V_{ref3}$. Thus, the output voltage $V_5$ becomes negative and the voltage $V_4$ becomes low. Thereby, the voltage $V_{APD}$ also becomes low, according to the voltage $V_4$, and M falls again. When the light input reaches $P_4$, the output voltage $V_5$ is saturated and thereafter M becomes constant. The voltage $V_{AGC}$ becomes low and the gain G also becomes small. Thus, M can approximate the optimum values indicated by the chained line.

As will be obvious from the above explanation, the present invention provides a light receiving circuit with a simple structure which can assure a wide light input dynamic range without allowing the SNR to deviate largely from the optimum value and without widening the desired variable gain width of the amplifier.

What we claim is:

1. A light receiving circuit having an output that is kept at a constant level by automatic gain control of the multiplication factor of an avalanche photodiode which converts a light signal into an electric signal and automatic gain control of an amplifier which amplifies an output of said avalanche photodiode, comprising:

means for applying a first control voltage to said avalanche photodiode for controlling said avalanche photodiode to have a multiplication factor which approximates with straight-line segments the optimum signal-to-noise ratio, and for applying a second control voltage to said amplifier for controlling its gain to provide said output with said constant level, said means including first comparing means for comparing a voltage proportional to said first control voltage and a signal corresponding to a first reference voltage, second comparing means for comparing the output of said amplifier and a second reference voltage, the output of the second comparing means corresponding to said second control voltage provided to said amplifier third comparing means for comparing a third reference voltage and said second control signal, the output of said third comparing means being coupled to said first reference voltage;

a high voltage generator circuit having an output connected to supply said first control signal to said avalanche photodiode, and a switch device having as inputs the outputs of said first and second comparing means and providing an output as an input of said high voltage generator circuit.

2. A light receiving circuit according to claim 1, wherein said first comparing means comprises a first differential amplifier having a voltage corresponding to said first control voltage applied to its inverting input, and having a voltage corresponding to said first reference voltage and to said output of said third comparing means applied to its non-inverting input, wherein said second comparing means comprises a second differential amplifier having a voltage corresponding to the output of said amplifier applied to its inverting input and having said second reference voltage applied to its non-inverting input, and wherein said third comparing means comprises a third differential amplifier having a signal corresponding to said third reference voltage applied to its inverting input and having said second control voltage applied to its non-inverting input.

3. A light receiving circuit according to claim 1, comprising a plurality of additional comparing means and a corresponding plurality of additional reference voltages, each said additional comparing means comparing a corresponding one of said additional reference voltages with said second control voltage, and wherein the outputs of said plurality of additional comparing means are coupled to said first reference voltage for providing said non-inverting input to said third comparing means.

4. A light receiving circuit according to claim 3, wherein each of said additional comparing means comprises a respective differential amplifier, the respective additional reference voltage being coupled to the respective inverting input of each of the differential amplifiers and said first control voltage being coupled to the non-inverting inputs of said differential amplifiers.

5. A light receiving circuit according to claim 1, wherein said first comparing means comprises a diode, said second and third comparing means respectively comprise first and second differential amplifiers, the anode of said diode being coupled to the first reference voltage while the cathode of the diode is coupled to the output of said high voltage generator circuit, said second reference voltage and said second control voltage being connected respectively to the non-inverting inputs of said first and second differential amplifiers, and a signal corresponding to said third reference voltage and a voltage corresponding to the output of said amplifier being coupled respectively to the inverting inputs of the first and second differential amplifiers.

6. A light receiving circuit for producing an electrical output signal in response to an incoming light signal comprising:

an avalanche photodiode to receive the light signal, said avalanche photodiode having a multiplication factor control port;

an amplifier responsive to the output of the avalanche photodiode, said amplifier having an automatic gain control port; and control means responsive to the output of said amplifier for supplying signals to said multiplication factor and automatic gain control ports to maintain said output of said amplifier at a substantially constant level while providing an avalanche multiplication factor of said avalanche photodiode that is a continuous function of the incoming light signal, said function including a first substantially straight-line segment that decreases when the incoming light signal increases between a first level and a higher second level, a second substantially straight-line segment that is substantially constant when the incoming light signal lies between said second level and a higher third level, a third substantially straight-line segment that falls when the incoming light signal increases between said third level and a fourth level, and a higher fourth substantially straight-line segment that is substantially constant when the incoming light signal increases between said fourth level and a higher fifth level.

7. The circuit of claim 6, wherein said control means comprises:

means for providing a signal corresponding to the output of said amplifier;

a first differential amplifier having a first input responsive to said means for providing a signal and a second input responsive to a first reference voltage;

a series connection of a first resistor and a first diode connected in common at a first intermediate connection point, said series connection thereof being connected between the output of said first differential amplifier and ground, said automatic gain control port being responsive to the potential at said first intermediate connection point;

a high voltage generator circuit having an input and an output;

a second diode connected between the output of the first differential amplifier and the input of the high voltage generator circuit; and means for communicating a signal corresponding to the output of said high voltage generator circuit to the multiplication factor control port.

8. The control circuit of claim 7, wherein said control means further comprises a second differential amplifier having a first input responsive to the potential at said first intermediate connection point and a second input responsive to a second reference voltage; and a series connection of a second resistor and a third diode connected in common at a second intermediate connection point, said series connection thereof being connected between the output of said second differential amplifier and ground.

9. The control circuit of claim 8, wherein said means for communicating a signal corresponding to the output of said high voltage generator circuit comprises an additional resistor connected between the output of said high voltage generator circuit and the multiplication factor control port, and wherein said control means further comprises a further diode and a further resistor series-connected between said second intermediate connection point and said multiplication factor control port.

10. The control circuit of claim 8, wherein said means for communicating a signal corresponding to the output of said high voltage generator circuit comprises a conductor connecting the output of said high voltage generator circuit ot said multiplication factor control port, and wherein said control means further comprises a series connection of third and fourth resistors commonly connected at a third intermediate connection point, said series connection thereof being connected between the output of said high voltage generator circuit and ground, a third differential amplifier having first and second inputs and an output, means for connecting the first input of said third differential amplifier to said second intermediate connection point, means for connecting the second input of said third differential amplifier to said third intermediate connection point, and a third diode connecting the output of said third differential amplifier to the input of said high voltage generator circuit.

11. The control circuit of claim 10, wherein said means for connecting the first input of said third differential amplifier to said second intermediate connection point comprises a series connection of fifth and sixth resistors commonly connected at a fourth intermediate connection point, and wherein said control means further comprises means for coupling a voltage corresponding to a third reference voltage at said fourth intermediate connection point.

12. The control circuit of claim 11, comprising a fourth diode is connected between one end of said series connection of said fifth and sixth resistors and ground, and wherein said control means further comprises at least one additional differential amplifier, each said at least one additional differential amplifier having a respective first input responsive to the potential at the first end of said series connection of said fifth and sixth transistors.

* * * * *

UNITED STATES PATENT AND TRADEMARK OFFICE
CERTIFICATE OF CORRECTION

PATENT NO. : 4,495,410

DATED : 22 Jan. 1985

INVENTOR(S) : Minami et al

It is certified that error appears in the above-identified patent and that said Letters Patent is hereby corrected as shown below:

Col. 1, line 32, after "with" delete ":".

Col. 3, line 23, after "means" insert --, wherein the--;
line 26, before "output" insert --the--;

line 64, "and G of an" should be regular print;
line 65, "amplifier" should be regular print.

Col. 4, line 5, after ";" insert --and--;
line 15, "13 and output to the output" should be --13, the output of which is connected to the output--.

Signed and Sealed this

Tenth Day of September 1985

[SEAL]

Attest:

DONALD J. QUIGG

*Attesting Officer*   *Acting Commissioner of Patents and Trademarks - Designate*

UNITED STATES PATENT AND TRADEMARK OFFICE
CERTIFICATE OF CORRECTION

PATENT NO. : 4,495,410

DATED : January 22, 1985

INVENTOR(S) : Minami et al

It is certified that error appears in the above-identified patent and that said Letters Patent is hereby corrected as shown below:

```
Column 3, line 29, after "amplifier" insert --,--;
          line 46, after "of" insert -- the --;
Column 6, line 8, after "51" insert --,--;
          line 9, delete "and associated elements";
          after "59" insert -- and associated elements--;
          line 11, after "resistor" insert -- 62 --;
          line 13, after "resistor" insert -- Rr--.
```

Signed and Sealed this

Twelfth Day of November 1985

[SEAL]

Attest:

Attesting Officer

DONALD J. QUIGG

Commissioner of Patents and Trademarks